(12) United States Patent
Nosrati et al.

(10) Patent No.: US 10,770,318 B2
(45) Date of Patent: Sep. 8, 2020

(54) HIGH TEMPERATURE TUBULAR HEATERS

(71) Applicant: Watlow Electric Manufacturing Company, St. Louis, MO (US)

(72) Inventors: Mohammad Nosrati, Redwood City, CA (US); Roger Brummell, Hannibal, MO (US); Kenneth D. Ames, San Jose, CA (US); Paul S. Whetstone, Hannibal, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 863 days.

(21) Appl. No.: 15/260,357

(22) Filed: Sep. 9, 2016

(65) Prior Publication Data

US 2017/0069514 A1 Mar. 9, 2017

Related U.S. Application Data

(60) Provisional application No. 62/216,003, filed on Sep. 9, 2015.

(51) Int. Cl.
| | |
|---|---|
| *H01L 21/67* | (2006.01) |
| *C01F 5/02* | (2006.01) |
| *C01F 7/02* | (2006.01) |
| *C01G 25/02* | (2006.01) |
| *C01B 21/072* | (2006.01) |

(Continued)

(52) U.S. Cl.
CPC ...... *H01L 21/67109* (2013.01); *C01B 21/072* (2013.01); *C01F 5/02* (2013.01); *C01F 7/02* (2013.01); *C01G 25/02* (2013.01); *C04B 37/021* (2013.01); *H01L 21/67115* (2013.01); *H05B 3/42* (2013.01); *C01P 2006/40* (2013.01); *C04B 2237/345* (2013.01); *C04B 2237/363* (2013.01);

(Continued)

(58) Field of Classification Search
CPC ... H05B 3/40; H05B 3/42; H05B 3/44; H05B 3/46; H05B 3/48; H05B 3/64; H05B 3/62; H05B 2203/016; H01L 21/67109; H01L 21/67138; H01L 21/67115; C04B 2237/345; C04B 2237/363; C04B 2237/40; C04B 37/021; C01P 2006/40; C01G 25/02; C01F 7/02; C01F 5/02; C01B 21/072

See application file for complete search history.

(56) References Cited

U.S. PATENT DOCUMENTS

| 4,088,258 A | 5/1978 | Regalbuto |
| 4,650,964 A | 3/1987 | Vincent |

(Continued)

FOREIGN PATENT DOCUMENTS

| GB | 345563 | 3/1931 |
| GB | 2000949 | 1/1979 |

(Continued)

OTHER PUBLICATIONS

ISR of PCT/US2016/050853 mailed Nov. 24, 2016.

*Primary Examiner* — Shawntina T Fuqua
(74) *Attorney, Agent, or Firm* — Burris Law, PLLC (57) ABSTRACT

A heater assembly includes a heating member, a mounting member that mounts the heating member to a wall of an external component, and an insulator disposed between the heating member and the wall. The insulator electrically insulates the heating member from the wall and blocks a ground path from the heating member to the wall of the external component.

20 Claims, 11 Drawing Sheets

(51) Int. Cl.
*C04B 37/02* (2006.01)
*H05B 3/42* (2006.01)
(52) U.S. Cl.
CPC .... *C04B 2237/40* (2013.01); *H05B 2203/016* (2013.01)

(56) References Cited

U.S. PATENT DOCUMENTS

2002/0185487 A1    12/2002   Divakar et al.
2008/0041836 A1*    2/2008   Gralenski ........... C23C 16/4411
                                                                      219/156

FOREIGN PATENT DOCUMENTS

| | | |
|---|---|---|
| JP | 3089196 | 9/2000 |
| TW | 529315 | 4/2003 |
| WO | 2010069438 | 6/2010 |
| WO | 2011020924 | 2/2011 |

\* cited by examiner

HIGH TEMPERATURE TUBULAR HEATERS

CROSS REFERENCE TO RELATED APPLICATIONS

The present application claims the benefit of U.S. Provisional Application No. 62/216,003, filed Sep. 9, 2015, titled "High Temperature Tubular Heaters," the contents of which are incorporated herein by reference in their entirety.

FIELD

The present disclosure relates to semiconductor processing apparatuses, and more particularly to heaters for the semiconductor processing apparatuses.

BACKGROUND

The statements in this section merely provide background information related to the present disclosure and may not constitute prior art.

Semiconductor processing involves various processes performed in a processing chamber. In these processes, heaters are used to maintain the wafer substrate to be processed at a targeted elevated temperature. The heaters may be implemented in various forms. For example, the heaters may be directly integrated into wafer processing chambers or the heaters may be used independently of other processing tools.

A heater generally includes a dielectric material that electrically insulates a resistive heating element that generates heat. Typical heaters used in the processing chambers can generally only operate at a temperature below 830° C. due to the limitations on the dielectric material. This is because the insulating strength of the dielectric material generally decreases with increased operating temperature. When the insulating strength of the dielectric material is weakened, dielectric breakdown will occur and short circuiting of the heater may result.

Moreover, leakage current increases exponentially as the temperature increases at a particular voltage. The increased leakage current, coupled with the reduced insulating strength of the dielectric material, increase the risk of leakage current flowing through ground, causing the heater to fail.

Further, the outer high emissivity protective surface of the heater may gradually degrade due to low partial pressure of oxygen environment and exposure to aggressive processing gases in the processing chamber. The degraded outer surface of the heater results in emissivity changes and decreased heat transfer from the resistive heating element, through the outer surface of the heater, to the surrounding environment. As a result, an internal temperature of the heater may become higher than an outer temperature of the heater, exacerbating weakening of the insulating strength of the dielectric material and increasing current leakage through the dielectric material.

SUMMARY

In one form of the present disclosure, a heater assembly includes a heating member, a mounting member that mounts the heating member to a wall of an external component, and an insulator disposed between the heating member and the wall. The insulator electrically insulates the heating member and blocks a ground path from the heating member to the wall of the external component.

In another form, a heater assembly includes a heating element, a metal sheath surrounding the heating element, a dielectric material disposed between the heating element and the metal sheath, and a coating disposed around the metal sheath. The coating includes an impervious material.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
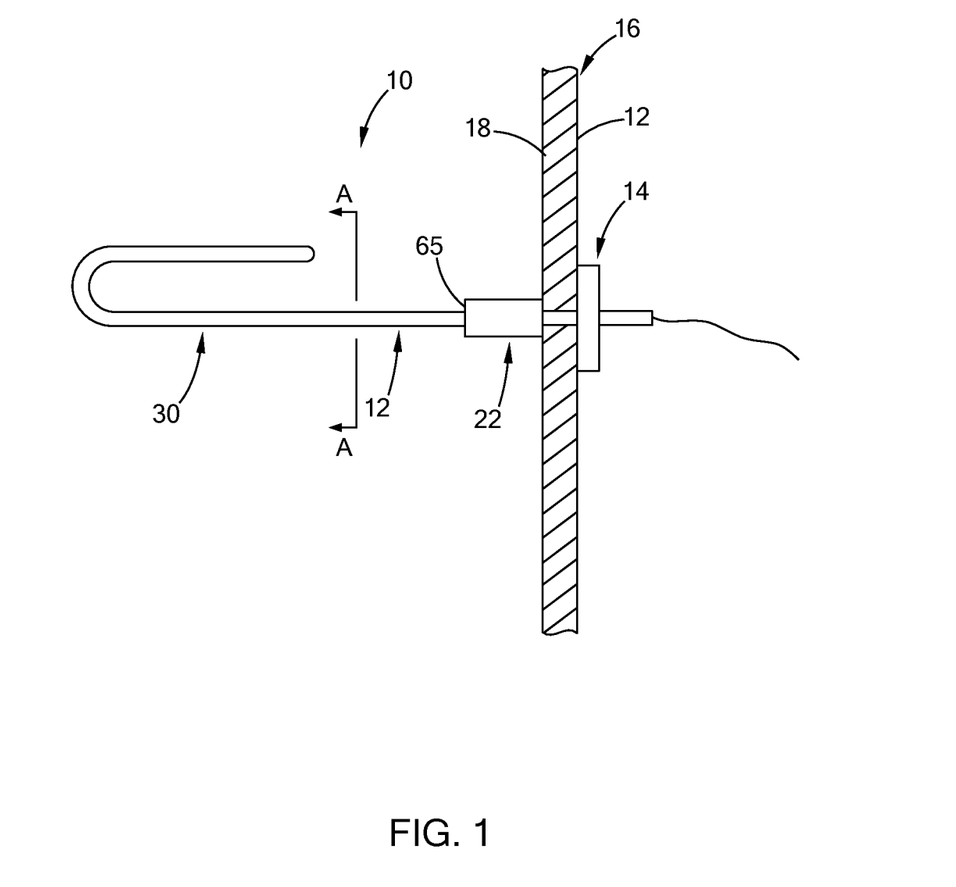
FIG. 1 is a side view of a heater assembly constructed in accordance with a first form of the present disclosure.

As shown in FIG. 1, a heater assembly according to the disclosure of the present application is generally indicated by reference 10. The heater assembly 10 includes a heating member 12 and a mounting member 14 that mounts the heating member 12 to a wall 16 of an external component, such as a wall of a semiconductor processing chamber or a wall of a processing tool or apparatus. The heating member 12 protrudes from an inner surface 18 of the wall 16 of the processing chamber. The mounting member 14 is disposed adjacent to an outer surface 20 of the wall 16. The heating member 12 further includes an insulator 22 disposed between the heating member 12 and the mounting member 14 and disposed adjacent to the inner surface 18 of the wall 16. The insulator 22 electrically insulates the heating member 12 from the wall 16 to thereby block a ground path from the heating member 12 through the wall 16 in case a heater failure results, which will be described in more detail below.

Figure 2:
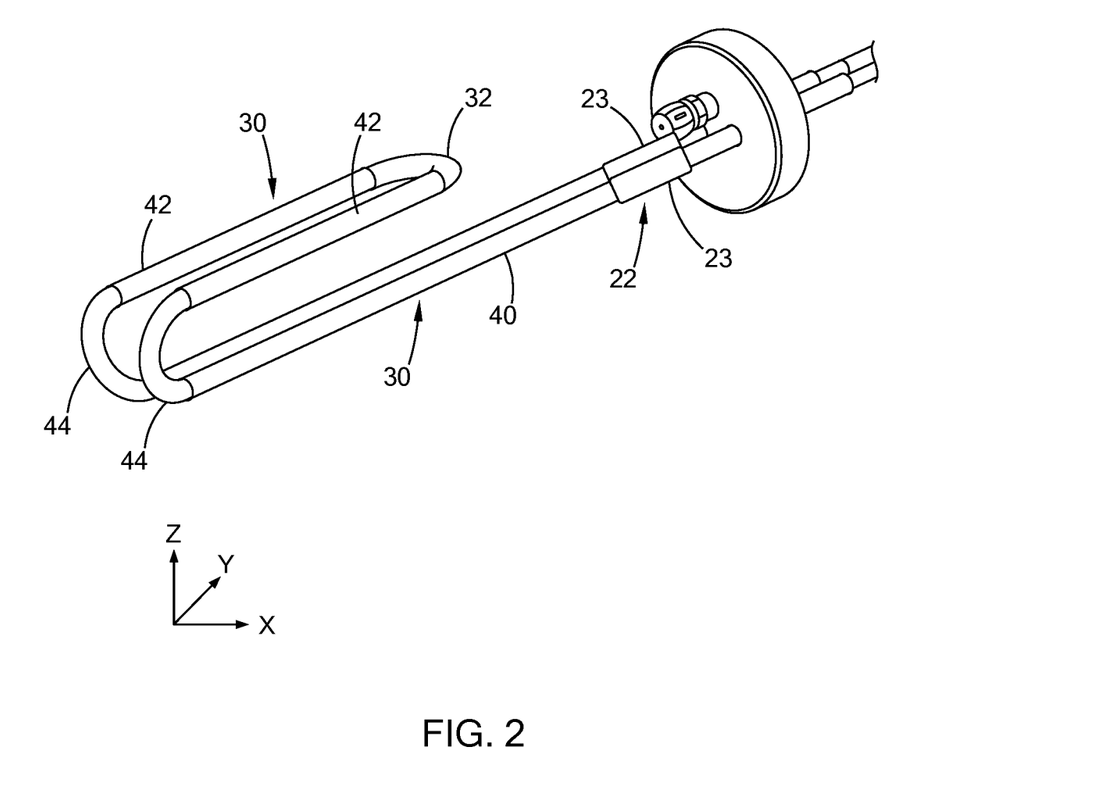
FIG. 2 is a perspective view of a heater assembly constructed in accordance with the teachings of the present disclosure.

Referring to FIG. 2, the heating member 12 includes a tubular construction and may include a pair of hook portions 30 and a curved connecting portion 32 connecting between the hook portions 30. The hook portions 30 are spaced apart along a horizontal direction, i.e., the X axis as shown in FIG. 2. The hook portions 30 each include a long leg 40, a short leg 42, and a bend portion 44 connecting between the long leg 40 and the short leg 42. The long leg 40 and the short leg 42 in each hook portion 30 are spaced apart vertically, i.e., along a Z axis. The curved connecting portion 32 extends on the X-Y plane, whereas the bend portions 44 extend on the Y-Z plane. The insulator 22 includes a pair of insulating parts 23 corresponding to the long legs 40 of the hook portions 30.

Figure 3:
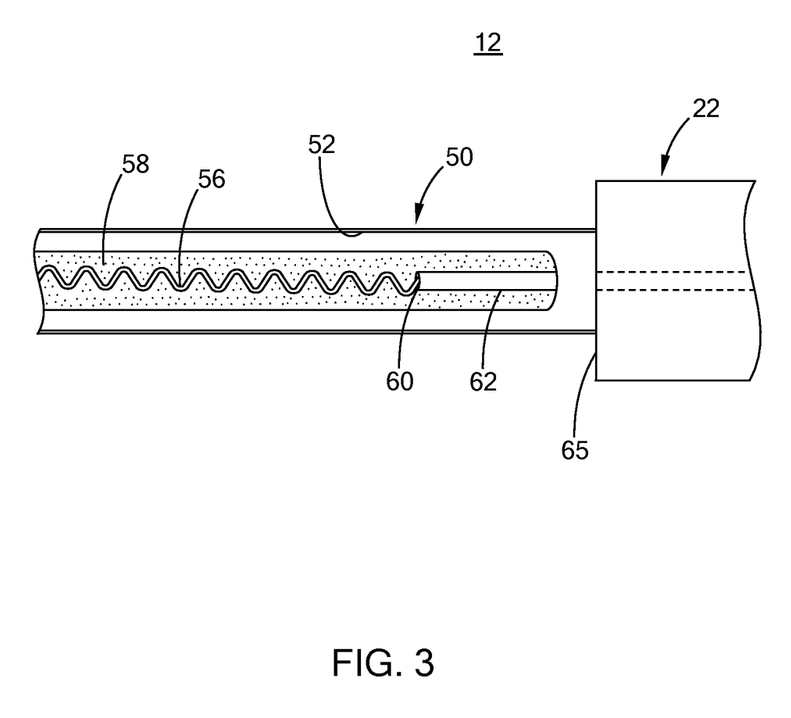
FIG. 3 is a partial cutaway view of the heater assembly of FIG. 1, showing the inside structure of the heater assembly.

Referring to FIG. 3, the heating member 12 may be a tubular heater in an exemplary form and may include a metal sheath 50 defining a space 52, a resistive element 56 received in the space 52, and a dielectric material 58 filling in the space 52 and electrically insulating the resistive element 56. The resistive element 56 may be in the form of resistive coil or wire and includes high electric resistivity. The metal sheath 50 has generally a metal tubular structure and includes a heat-resistant metal, such as stainless steel, a nickel-chromium alloy such as the Inconel® brand alloy or other high refractory metals. The dielectric material 58 may be a material with a desired dielectric strength, heat conductivity and life and may include magnesium oxide (MgO), aluminum oxide (Al$_2$O$_3$), zirconium oxide (ZrO$_2$), or aluminum nitride (AlN). The resistive element 56 is disposed inside the metal sheath 50 and extends through one of the hook portions 50, through the connecting curved portion 32 to the other one of the hook portions 50 of the heating member 12. The resistive element 56 has opposing ends 60 (only one is shown in FIG. 3) connected, for example by welding, to a pair of terminal pins 62. The terminal pins 62 extend through corresponding insulating parts 23 of the insulator 22 and the wall 16 and are connected to an external power supply. The metal sheath 50 is terminated at an end surface 65 of the insulator 22. In one form, the thermal conductivity of the dielectric material is between 60-180 W/m K.

Figure 4:
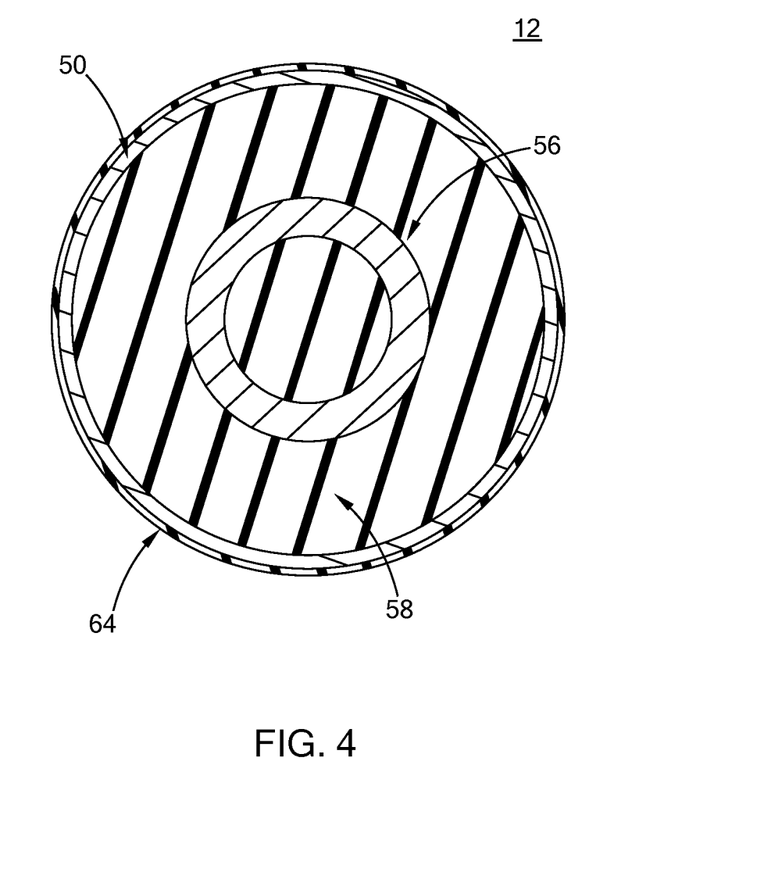
FIG. 4 is a cross-sectional view of the heater assembly, taken along line A-A of FIG. 1.

As shown in FIG. 4, the heating member 12 further includes an outer coating 64 on an entire outer surface of the metal sheath 50. The coating 64 is impervious to the processing environments, such as corrosive gases, which may exist in the processing chamber and thus may degrade at a relatively lower rate. The coating 64 includes a material having high emissivity, such as graphite, composites or oxide materials, particularly nickel-chromium-magnesium oxide, and may have an emissivity in the range of 0.8 to 1. With the high emissivity property, the coating 64 can more quickly radiate heat from the surface of the metal sheath 50 to the surrounding environment. Therefore, the internal temperature of the heating member 12 can be maintained within a predetermined range without overheating. The coating 64 can reduce the possible dielectric breakdown and consequently in operation of the heater. An impervious high emissivity coating 64 also helps improve efficiency in radiant heat transfer, overall life reliability and stability of the heater function.

As shown in FIG. 1 and FIG. 3, the insulator 22 is disposed between the mounting member 14 and the heating member 12, particularly between the metal sheath 50 and the wall 16 to provide electrical insulation between the metal sheath 32 and the wall 16. The terminal pins 62, which are connected to the resistive element 56, extend through the insulator 22 and the wall 16 to be connected to an external power supply. The metal sheath 50, however, is terminated at an end surface 65 of the insulator 22. The termination pins 62 are also electrically insulated from the wall 16. When the heater assembly 12 functions normally, the electric current flows through the resistive element 56 and does not flow through the metal sheath 50. As the heater assembly operates at an elevated temperature, the dielectric strength of the dielectric material becomes weakened and the coating 64 may degrade, causing the dielectric breakdown and the current leakage through the dielectric material to the metal sheath 50. By providing the insulator 22 between the metal sheath 50 and the wall 16, a ground path from the metal sheath 50 to the wall 16 is blocked. As a result, the heating member 12 can continue to operate at higher temperatures. Therefore, the dielectric strength of the dielectric material 58 is not as much of a limiting factor in the heater design. A high melting-point resistive material can be used to form the resistive element 56 to increase the operating temperature of the heater assembly 10 to a temperature above 850° C. or even above 1000° C. The heater assembly 10 will continue to operate even under dielectric breakdown until an open circuit is formed due to the resistive element 56 being burned out and disconnected.

The insulator 22 is provided adjacent to the cold section of the heating member 12, i.e., where the opposing ends 60 of the resistive element 56 are connected to the terminal pins 62. The terminal pins 62 may extend through the corresponding insulating parts 23 of the insulator 23, whereas the metal sheath 50 terminates at the end surface 65 of the insulator 22. Therefore, the heater is electrically floating and the leakage current through resistive element 56, the insulator 22 and the metal sheath 50 is inhibited. The heater assembly 10 can thus continue to operate without a risk of being inoperative.

Figure 5:
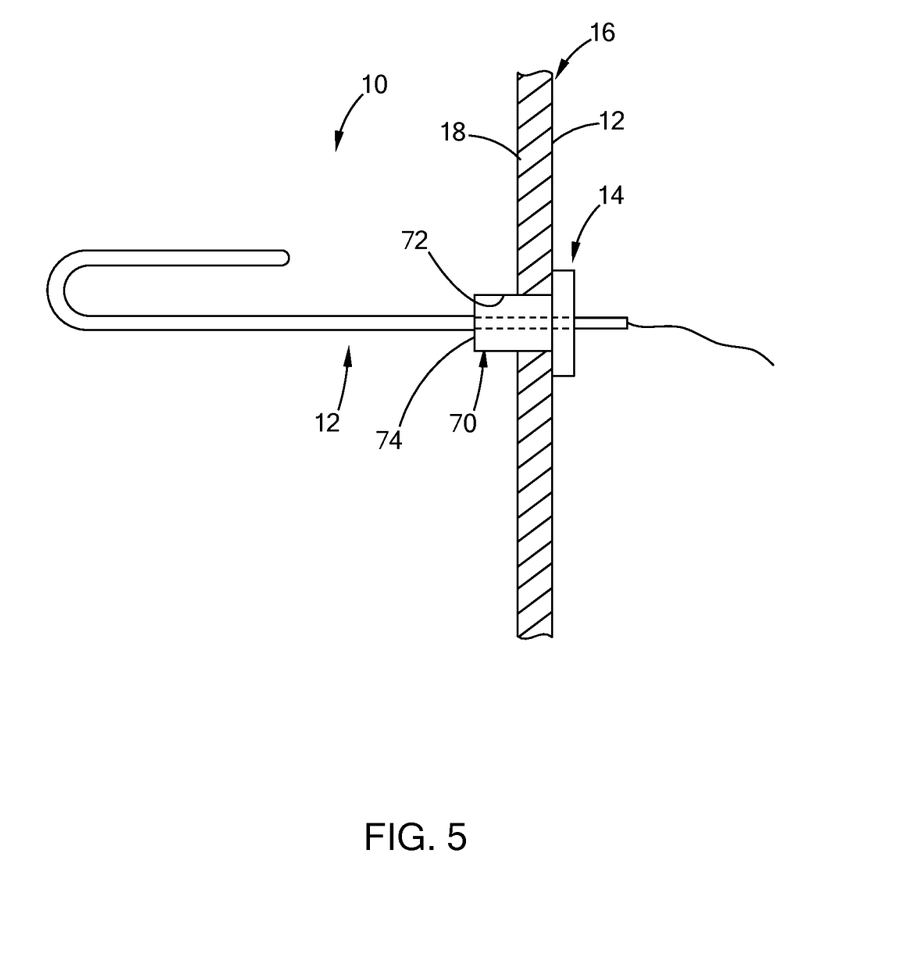
FIG. 5 is a side view of a heater assembly constructed in accordance with a second form of the present disclosure.

As shown in FIG. 5, in another form, the insulator 70 may be in the form of a feedthrough that is inserted through an opening 72 of the wall 16. The metal sheath 50 is terminated at one end surface 74 of the insulator 70, whereas the terminal pin 62 that is connected to the resistive element 56 extends through the insulator 70 and the mounting member 14 to be connected to an external power.

Figure 6:
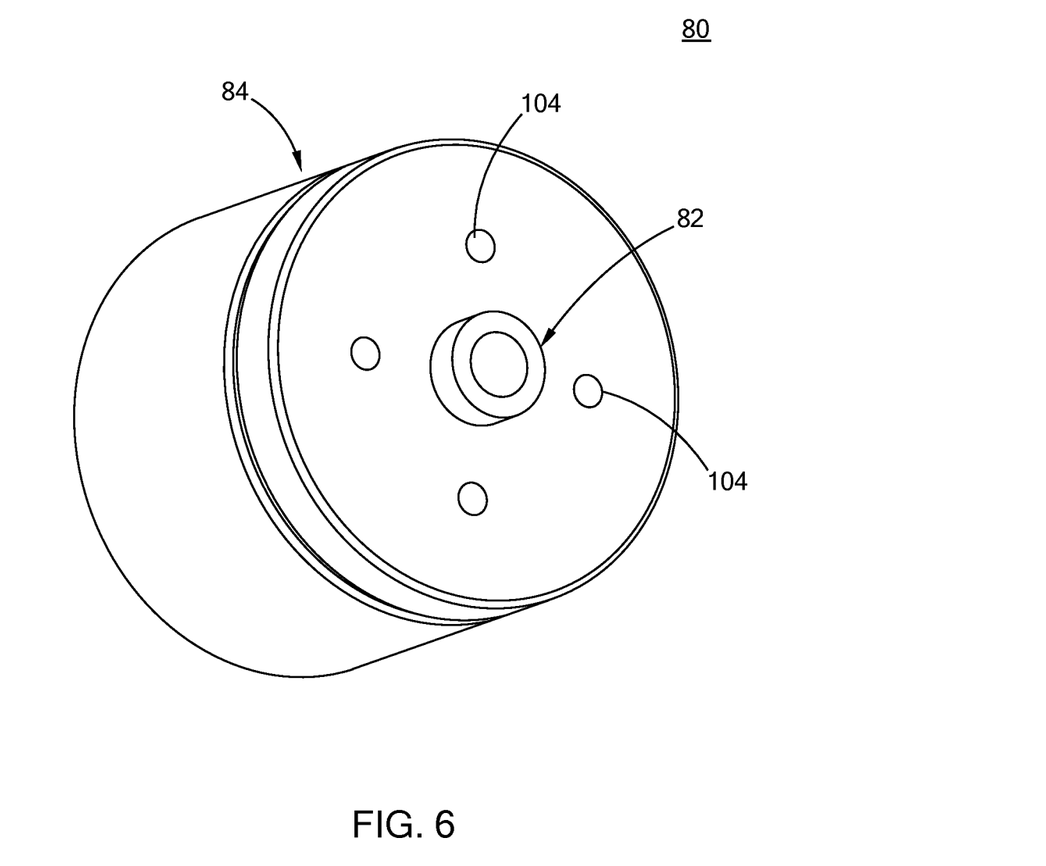
FIG. 6 is a perspective view of a heater assembly constructed in accordance with a third form of the present disclosure.
Figure 7:
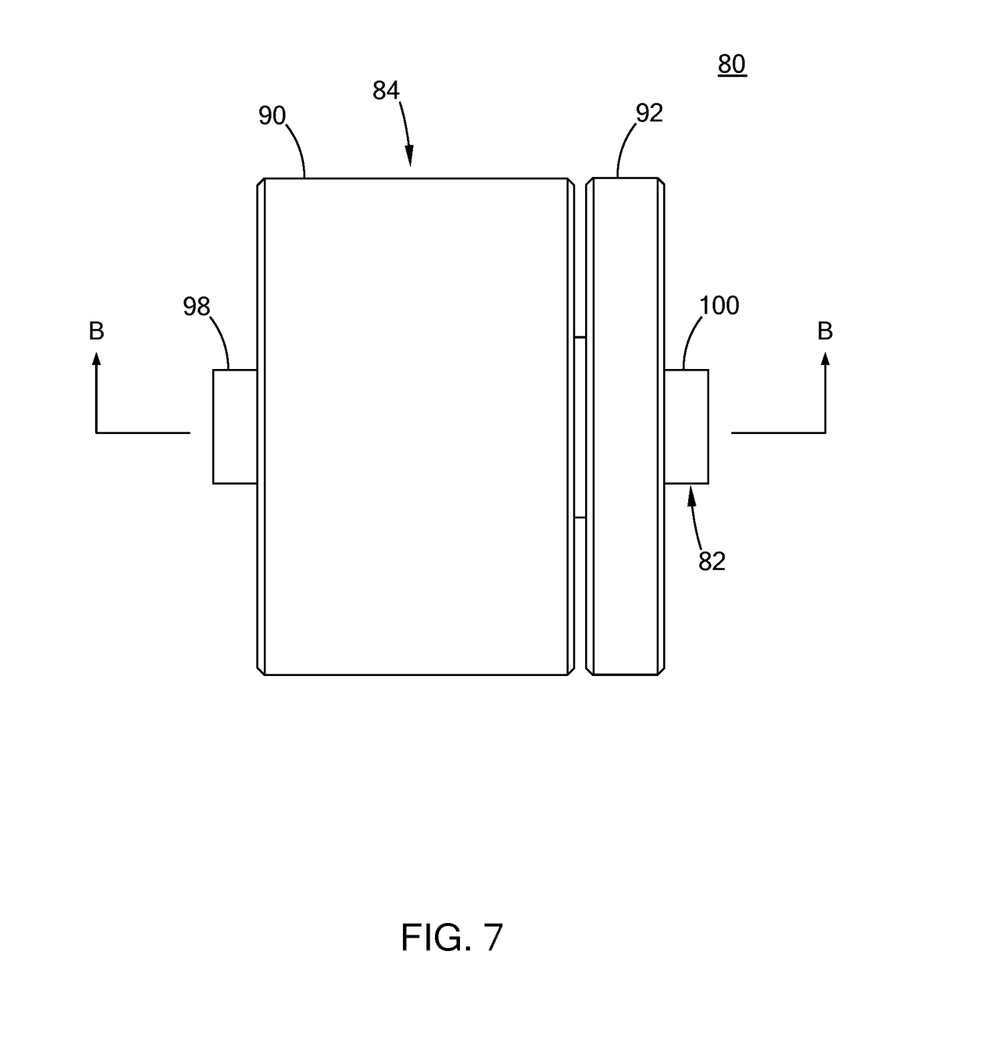
FIG. 7 is a side view of the heater assembly of FIG. 6.
Figure 8:
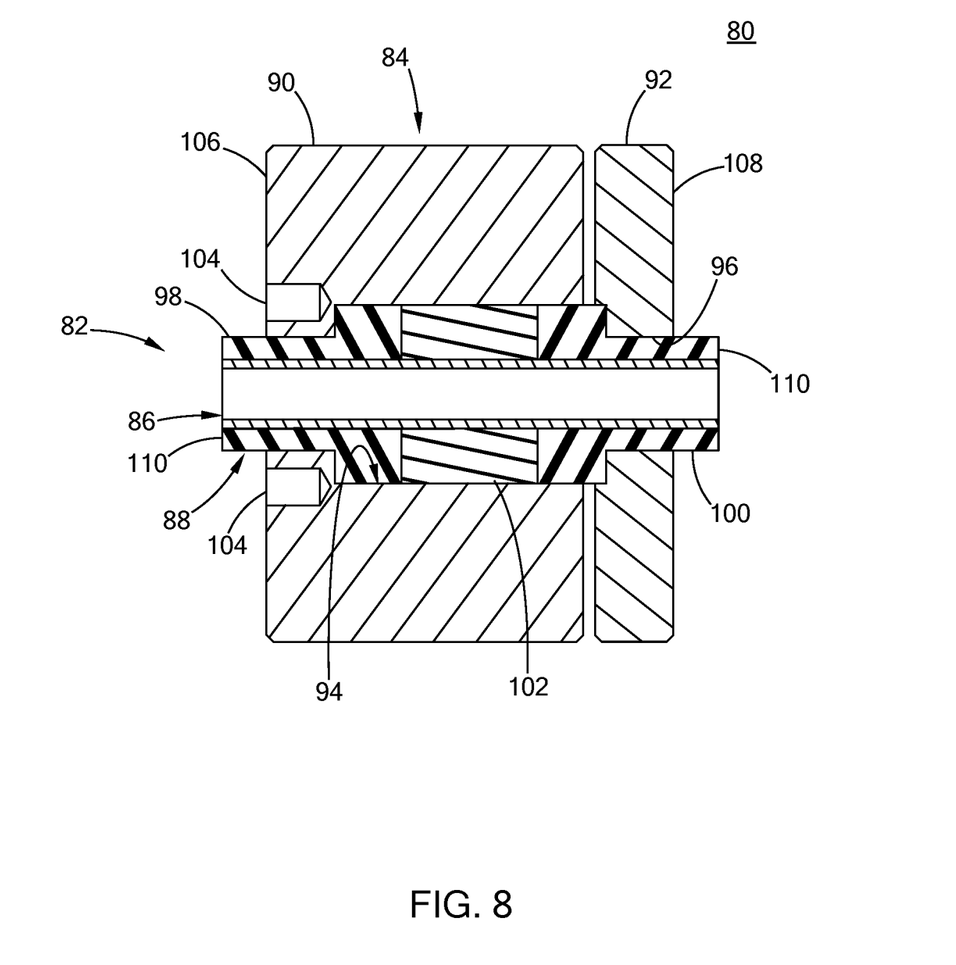
FIG. 8 is a cross-sectional view of the heater assembly, taking along line B-B of FIG. 7.

Referring to FIGS. 6 through 8, a heater assembly 80 in accordance with a third form of the present disclosure includes a heating member 82 and a mounting member 84 that mounts the heating member 82 to a wall of a semiconductor processing chamber or a wall of other tools. Only a portion of the heating member 82 disposed adjacent to the mounting member 84 is shown for clarity. It is noted that the heating member 82 may have a configuration similar to that shown in FIG. 2 or may have any other configurations known in the art depending on heating requirements without departing from the scope of the present disclosure.

The heating member 82 includes a metal sheath 86 that encloses a resistive heating element and a dielectric material (shown in FIG. 3, but not shown in FIGS. 6 to 8) therein, and an insulator 88 surrounding a portion of the metal sheath 86 and proximate the mounting member 84. The insulator 88 may be made of polyether ether ketone ("PEEK") or ceramic, and electrically insulates the metal sheath 86 from the mounting member 84. When dielectric breakdown occurs in the dielectric material of the heating member 82, the insulator 88 blocks a ground path from the metal sheath 86 through the mounting member 84 to the wall of the processing chamber.

The mounting member 84 may include an inner flange 90 proximate the inside of the semiconductor processing chamber and an outer flange 92 distal from the inside of the semiconductor processing chamber. The inner and outer flanges 90, 92 may be made of aluminum. The inner flange 90 and the outer flange 92 each define an opening 94, 96, in which the insulator 88 is disposed. The inner flange 90 is shown to be thicker than the outer flange 92 in FIG. 8. It is understood that the inner flange 90 and the outer flange 92 may be formed to have the same thickness.

The insulator 86 may include an inner section 98, and outer section 100, and a vacuum seal 102 between the inner section 98 and the outer section 100. The vacuum seal 102 establishes an air-tight interface between the vacuum seal 102 and the mounting member 84 to avoid gas leakage in or from the semiconductor processing chamber through the interface between the heating member 82 and the mounting member 84. The vacuum seal 102 may be provided inside the opening 94 of the inner flange 90. Alternatively, the insulator 88 may be formed of one-piece component with a seal property to seal against the mounting member 84.

Both the inner and outer flanges 90 and 92 may include screw holes or bolt holes 104. Screws or bolts (not shown) are inserted into the screw holes or bolt holes 104 to secure the heater assembly 80 to the wall of the processing chamber. While the insulator 88 is shown to protrude from an inner surface 106 and an outer surface 108 of the mounting member 84, the insulator 88 may be formed to have end surfaces 110 flush with the inner and outer surfaces of the mounting member 84.

Figure 9:
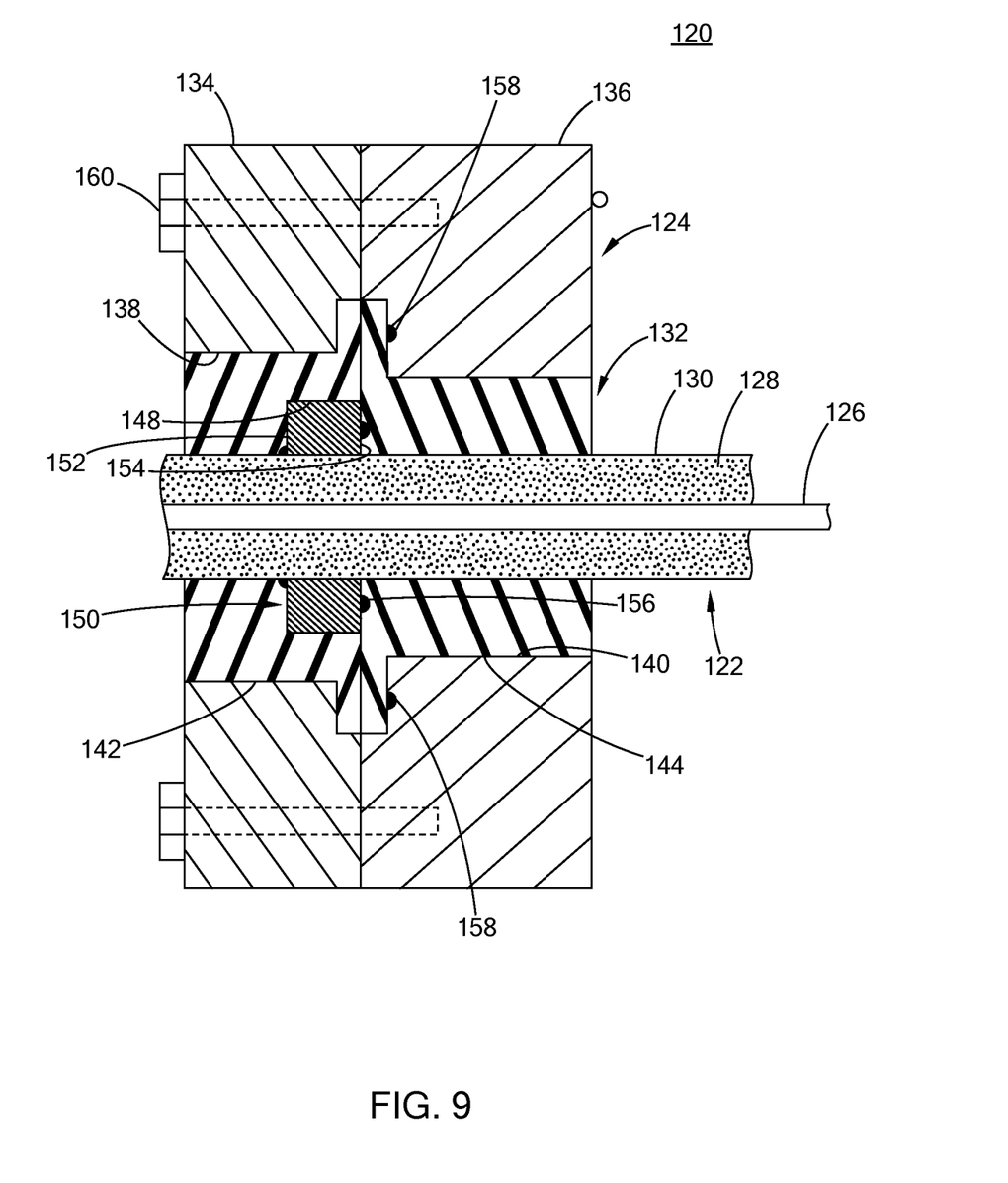
FIG. 9 is a cross-sectional view of a heater assembly constructed in accordance with a fourth form of the present disclosure.

Referring to FIG. 9, a heater assembly 120 constructed in accordance with a fourth form of the present disclosure includes a heating member 122 and a mounting member 124 for mounting the heating member 122 to a wall of a semiconductor processing wall or a wall of a processing tool. The heating member 122 includes a resistive heating element 126, a dielectric material 128, a metal sheath 130 surrounding and enclosing the resistive heating element 126 and the dielectric material 128 therein. The heating member 122 further includes an insulator 132 disposed around the metal sheath 130 proximate the mounting member 124. The insulator 132 electrically insulates the heating member 122 from the mounting member 124 in case dielectric breakdown occurs in the heating member 122.

The mounting member 124 includes an inner flange 134 proximate an inside of the semiconductor processing chamber, and an outer flange 136 distal from the inside of the semiconductor processing chamber. The inner and outer flanges 134 and 136 each define an opening 138 and 140, in which the insulator 132 is disposed.

The insulator 122 includes an inner section 142 and an outer section 144 in the openings 138 and 140 of the inner and outer flanges 134 and 136, respectively. The inner section 142 defines an enlarged opening 148 for receiving a metal collar 150 therein. The metal collar 150 surrounds the metal sheath 138 of the heating member 122 and disposed inside the inner flange 134 of the mounting member 124. The metal collar 150 has an inner end face 152 and an outer end face 154. The inner end face 152 of the metal collar 150 is welded to the inner section 142 of the insulator 132. An O ring 156 is disposed at an interface between the outer end face 154 of the metal collar 150 and the outer section 144 of the insulator 132. Another O ring 158 is provided at an interface between the outer section 144 of the insulator 132 and the outer flange 136 of the mounting member 124. Fastening means 160, such as screws or bolts, may be provided at the inner flange 134 of the mounting member 124 for attaching the mounting member 124 to the wall of the semiconductor processing chamber or the wall of the processing tool. Similarly, the insulator 122 may be made of polyether ether ketone ("PEEK") or ceramic.

Figure 10:
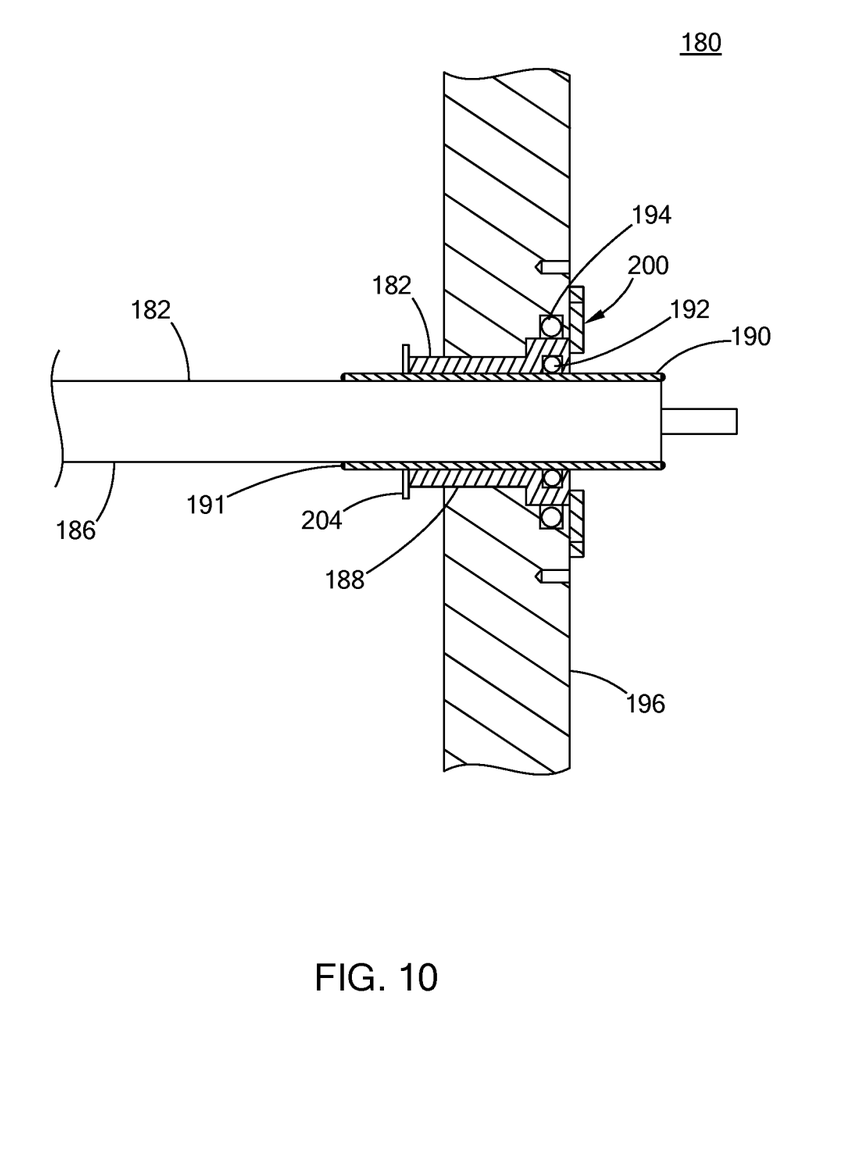
FIG. 10 is a cross-sectional view of a heater assembly constructed in accordance with a fifth form of the present disclosure.

Referring to FIG. 10, a heater assembly 180 constructed in accordance with a fifth form of the present disclosure includes a heating member 182 and a mounting member 184 surrounding the heating member 182. As in the previous forms, the heating member 182 may include a metal sheath 186, a dielectric material (not shown), and a resistive heating element (not shown) disposed inside the metal sheath 186.

The mounting member 184 includes an insulator 188 and a sleeve 190 surrounding the metal sheath 186 of the heating member 182. The insulator 188 surrounds the sleeve 190 and may be made of polyether ether ketone ("PEEK") or ceramic. The sleeve 190 may be welded at a welding area 191 to the metal sheath 186 of the heating member 182. An O ring 192 is provided between the sleeve 190 and the insulator 188, particularly in a groove of the insulator 188 to provide a sealed interface between the sleeve 190 and the insulator 188. Another O ring 194 is provided between the insulator 188 and a wall 196 of the semiconductor processing chamber to provide a sealed interface therebetween. The mounting member 184 further includes a cap 200 to cover the interface between the insulator 188 and the wall 199. The cap 200 may be made of stainless material. Optionally, a limit washer 204 can be attached an end face of the insulator 188.

Figure 11:
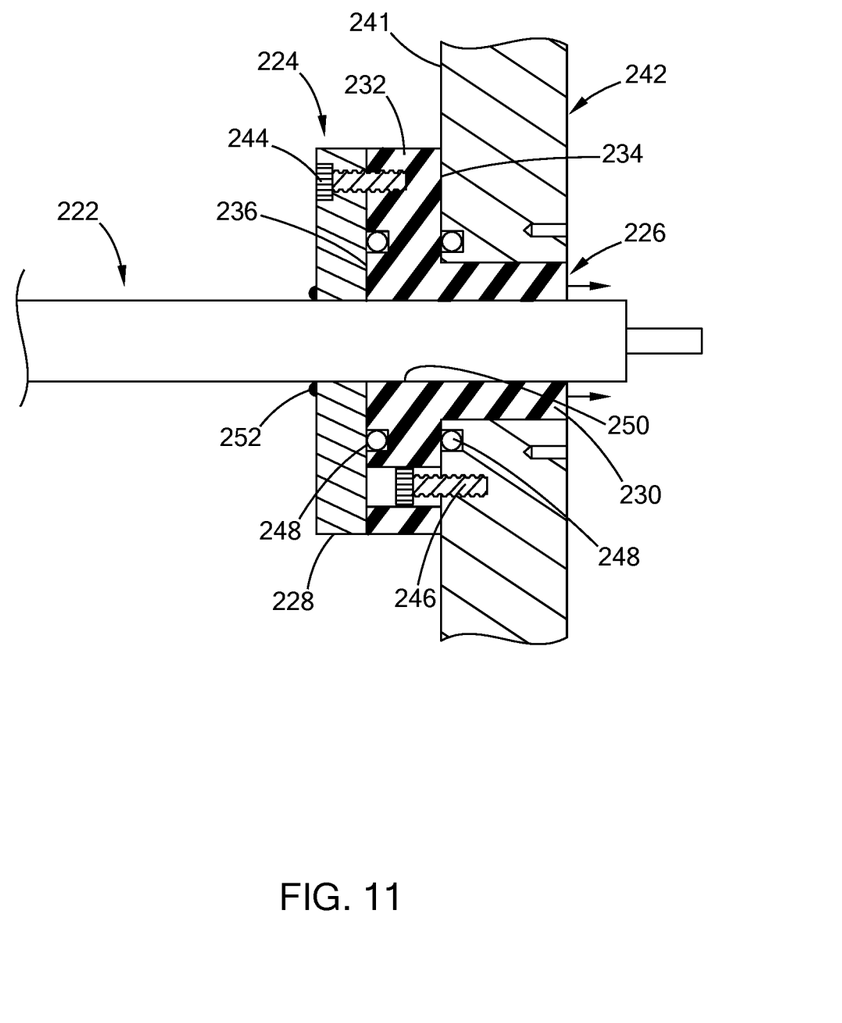
FIG. 11 is a cross-sectional view of a heater assembly constructed in accordance with a sixth form of the present disclosure.

Referring to FIG. 11, a heater assembly 220 constructed in accordance with a sixth form of the present disclosure includes a heating member 222 and a mounting member 224 for mounting the heating member 222 to a wall 242 of a semiconductor processing chamber or a wall of a processing tool.

The mounting member 224 includes an insulator 226 and a mounting plate 228 attached to the insulator 226. The insulator 226 includes a first cylindrical portion 230 extending through the wall 242 and a second enlarged cylindrical portion 232 disposed proximate an inner surface 241 of the wall 242. The second enlarged cylindrical portion 232 includes a first end face 234 facing the inner surface 241 of the wall 242, and a second end face 236 facing the mounting plate 228. The mounting plate 228 is attached to the second enlarged cylindrical portion 232 of the insulator 226 by a first fastening means 244, such as screws or bolts. The mounting plate 228 and the second enlarged cylindrical portion 232 of the insulator 226 are disposed inside the semiconductor processing chamber. The insulator 226 and the mounting plate 228 define a central opening 250 through which the heating member 22 extends. The heating member 222 may be secured to the mounting member 224, particularly the mounting plate 228, by a weld 252. The mounting member 224 is secured to the wall 242 by a second fastening means 246.

An O ring 248 is provided at each of the first and second end faces 234 and 236 of the second enlarged cylindrical portion 232 of the insulator 226 to provide a sealed interface between the first end face 234 and the inner surface 241 of the wall 242 and a sealed interface between the mounting plate 228 and the insulator 226. The insulator 226 may be made of polyether ether ketone ("PEEK") or ceramic In the present form, when dielectric breakdown occurs in the heating member 222, the insulator 226 electrically insulates the heating member 222 from the wall 242 of the semiconductor processing chamber to block a ground path.

Therefore, the heating member 222 may continue to operation despite electric breakdown inside a metal sheath of the heating member 222.

It should be noted that the disclosure is not limited to the form described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A heater assembly, comprising:
   a heating member comprising a resistive element and a dielectric material surrounding and electrically insulating the resistive element;
   a mounting member that mounts the heating member to a wall of an external component; and
   an insulator disposed between the heating member and the wall of the external component and electrically insulates the heating member from the wall and blocks a ground path from the heating member to the wall of the external component,
   wherein the resistive element is electrically insulated by both the dielectric material and the insulator during normal operation of the heating member, and the resistive element remains electrically insulated by the insulator during a dielectric breakdown of the dielectric material due to the ground path from the resistive element to the wall of the external component being blocked by the insulator.

2. The heater assembly according to claim 1, wherein the heating member is a tubular heater.

3. The heater assembly according to claim 1, wherein the heating member further comprises a metal sheath surrounding the dielectric material and the resistive element.

4. The heater assembly according to claim 3, wherein the insulator electrically insulates the metal sheath from the wall of the external component.

5. The heater assembly according to claim 4, wherein the metal sheath terminates at one end surface of the insulator.

6. The heater assembly according to claim 3, further comprising terminal pins extending through the insulator and connected to the resistive element.

7. The heater assembly according to claim 3, wherein the heating member further includes an impervious coating on an outer surface of the metal sheath.

8. The heater assembly according to claim 7, wherein the impervious coating has an emissivity in the range of 0.8 to 1.

9. The heater assembly according to claim 7, wherein the impervious coating includes a material selected from a group consisting of graphite, composite materials, oxide materials, and nickel-chromium-magnesium oxide.

10. The heater assembly according to claim 4, wherein the dielectric material is selected from a group consisting of magnesium oxide (MgO), aluminum oxide ($Al_2O_3$), zirconium oxide ($ZrO_2$), and aluminum nitride (AlN).

11. A heater assembly comprising:
    a heating element;
    a metal sheath surrounding the heating element;
    a dielectric material disposed between the heating element and the metal sheath; and
    a coating disposed around the metal sheath,
    wherein the coating includes an impervious material.

12. The heater assembly according to claim 11, further comprising an insulator that electrically insulates the metal sheath from an external component to which the heater assembly is mounted.

13. The heater assembly according to claim 12, wherein the metal sheath abuts against one end surface of the insulator.

14. The heater assembly according to claim 11, wherein the dielectric material has a thermal conductivity between 60-180 W/m K.

15. The heater assembly according to claim 14, wherein the dielectric material is aluminum nitride (AlN).

16. The heater assembly of claim 12, further comprising a termination pin connected to the resistive element and extending through the insulator.

17. The heater assembly according to claim 11, wherein the impervious material has an emissivity in the range of 0.8 to 1.

18. The heater assembly according to claim 11, wherein the impervious material is selected from a group consisting of graphite, composite materials, oxide materials, and nickel-chromium-magnesium oxide.

19. The heater assembly according to claim 11, wherein the dielectric material is selected from a group consisting of magnesium oxide (MgO), zirconium oxide ($ZrO_2$), aluminum oxide ($Al_2O_3$), and aluminum nitride (AlN).

20. The heater assembly according to claim 11, wherein the resistive element has a high melting point in the range of 1300-1400° C.

* * * * *